United States Patent [19]
Hato

[11] Patent Number: 6,048,668
[45] Date of Patent: Apr. 11, 2000

[54] METHOD FOR PATTERNING FILM AND METHOD FOR EXPOSING RESIST FILM

[75] Inventor: Tsunehiro Hato, Kawasaki, Japan

[73] Assignee: Fujitsu Limited, Kawasaki, Japan

[21] Appl. No.: 09/017,693

[22] Filed: Feb. 3, 1998

[30] Foreign Application Priority Data

Aug. 29, 1997 [JP] Japan .................................... 9-235003

[51] Int. Cl.[7] .................................................. G03C 5/00
[52] U.S. Cl. ......................... 430/296; 430/313; 430/327; 430/942; 250/492.3
[58] Field of Search ...................... 430/311, 313, 430/327, 296, 942; 250/492.2, 492.21, 492.3

[56] References Cited

U.S. PATENT DOCUMENTS 4,702,993  10/1987  White et al. .............................. 430/296
4,976,818  12/1990  Hashimoto et al. ..................... 156/643

FOREIGN PATENT DOCUMENTS

2-174216  7/1990  Japan .

*Primary Examiner*—Sharon Gibson
*Assistant Examiner*—Jill N. Holloman
*Attorney, Agent, or Firm*—Staas & Halsey, LLP

[57] ABSTRACT

Patterning a film by accumulating a first electric charge in a first area of a film under treatment, applying a resist to the film, and subsequently exposing a second area of the resist adjoining the first area to the first electric charge.

14 Claims, 12 Drawing Sheets

METHOD FOR PATTERNING FILM AND METHOD FOR EXPOSING RESIST FILM

BACKGROUND OF THE INVENTION

1. Field of the Invention

This invention relates to a method for patterning a film, inclusive of steps of exposing and developing a resist, and a method for exposing resist film.

2. Description of the Prior Art

The process of manufacturing a semiconductor device comprises a step of patterning a film formed of a semiconductor, a conductor, or an insulator. The patterning of this film is generally accomplished by masking a substrate with a resist and etching the part of the substrate that is left uncovered with the mask.

The production of a mask from a resist proceeds from a step of spreading the resist on a film, then through a step of exposing the resist thereby forming a latent image thereon, and subsequently to a step of developing the resist thereby visualizing the latent image.

For the exposure, a method which resides in irradiating the resist with an ionizing radiation is generally adopted. The term "ionizing radiation" refers to such a concept as embraces not only such lights as ultraviolet light and i light but also such beams of charged particles as electron beams and ion beams. As the resist, a material which proves to be appropriate for the kind of ionizing radiation adopted for the exposure is selected.

An electron beam (EB) resist is used when an electron beam is adopted for the exposure. The patterning of the EB resist is carried out as follows.

Figure 1A:
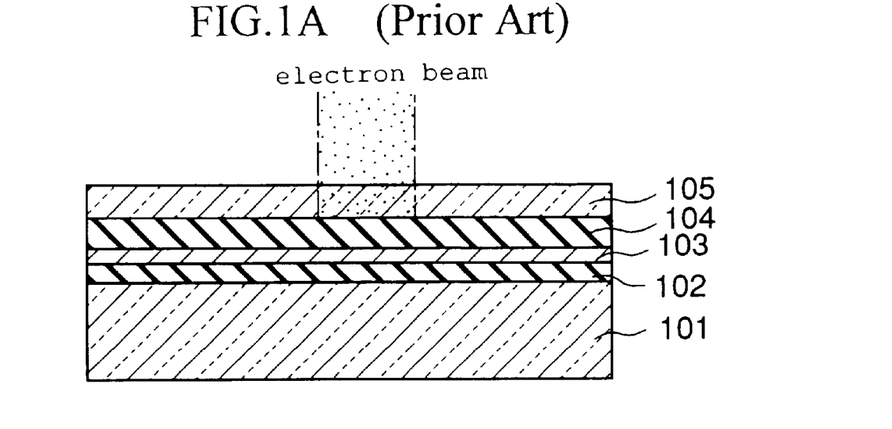
FIGS. 1A and 1B are cross sections illustrating the conventional process for exposure to an electron beam.

First, as illustrated in FIG. 1A, a lower insulating film 102, a wiring 103, and an upper insulating film 104 are formed on a semiconducting substrate 101 and a positive electron beam resist 105 is spread on the upper insulating film 104. Thereafter, the electron beam resist 105 is irradiated with an electron beam to form a latent image on the electron beam resist 105.

Figure 1B:
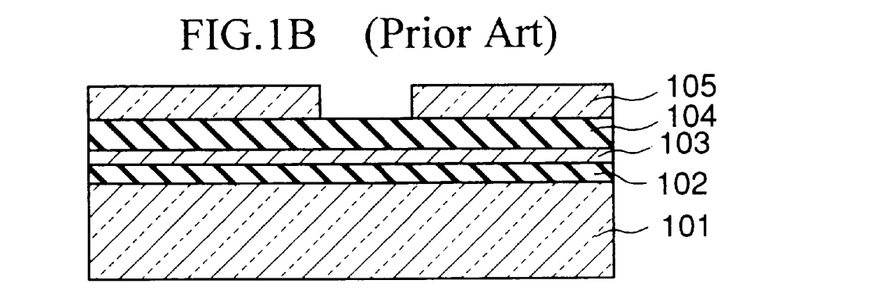

Next, the electron beam resist 105 is developed to form a pattern therein as illustrated in FIG. 1B.

Thereafter, the upper insulating film 104 is etched, with the resist pattern as a mask.

The patterning of the insulating film is presumed, for example, to shape a dielectric film such as a capacitor and form a contact hole in an interlayer insulating film.

Figure 2:
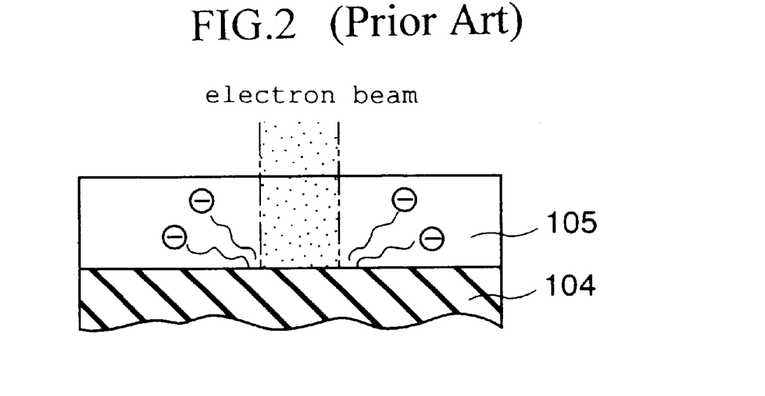
FIG. 2 is a cross section illustrating diffusion of electrons in a resist due to the conventional exposure to an electron beam.

When the exposure of the electron beam resist 105 is effected by the use of an electron beam as described above, the negative charge which passes through the electron beam resist 105 accumulates in the insulating film and the electron beam which is subsequently used for the exposure inevitably spreads in the lateral direction under the influence of the Coulomb force as illustrated in FIG. 11. The consequence is the disadvantage that the area of exposure of the electron beam will be substantially dilated.

Further, the electron beam resist offers low resistance to such dry etchings as reactive ion etching (RIE) and ion milling as compared with the resist of the quality proper for exposure to such lights as i light and ultraviolet light. When the insulating film to be patterned is formed of a material slow in etching, the practice of applying an electron beam resist in a large thickness is generally followed.

When the electron beam resist is applied in a layer large in thickness, however, the increase of the thickness augments proportionately the expansion of electrons and inevitably adds to the width of pattern of the latent image to be formed in the electron beam resist and renders it difficult to improve the pattern in fineness.

The problem just mentioned arises likewise when the resist is to be patterned by the use of a cation beam.

SUMMARY OF THE INVENTION

It is an object of this invention to provide a method for patterning a film comprising, among other things, a step of resist exposure which, during the exposure of a resist to an electron beam or a cation beam, is capable of repressing diffusion of a latent image pattern thereby ensuring production of a latent image pattern with fineness.

This invention contemplates preliminarily accumulating a negative charge or a positive charge on the surface of a film to be fabricated (film under treatment), then spreading a resist on the film under treatment, and subsequently exposing the resist to an electron beam or an ion beam, and further developing the exposed resist.

The negative charge or the positive charge arising from the exposure of the resist, therefore, curbs itself from diffusing on the surface of the film under treatment owing to the Coulomb force it generates jointly with the charge accumulated in advance on the surface of the film under treatment, with the result that the latent image to be formed in the resist will no longer be conspicuously blurred and the resist pattern will be produced with high accuracy.

Incidentally, the Coulomb force functions as a repulsive force when the charge accumulated on the film under treatment and the charge to which the resist is exposed equal in polarity. The first area in which the charge is accumulated in the film under treatment and the area in which the resist is exposed to the charge, therefore, must adjoin each other. When the charge accumulated in the film under treatment and the charge to which the resist is exposed are inverse in polarity, the area in which the charge is accumulated in the film under treatment and the area in which the resist is exposed to the charge coincide.

DESCRIPTION OF THE PREFERRED EMBODIMENTS

Now, embodiments of the present invention will be described below with reference to the accompanying drawings.

(First embodiment)

Figure 3:
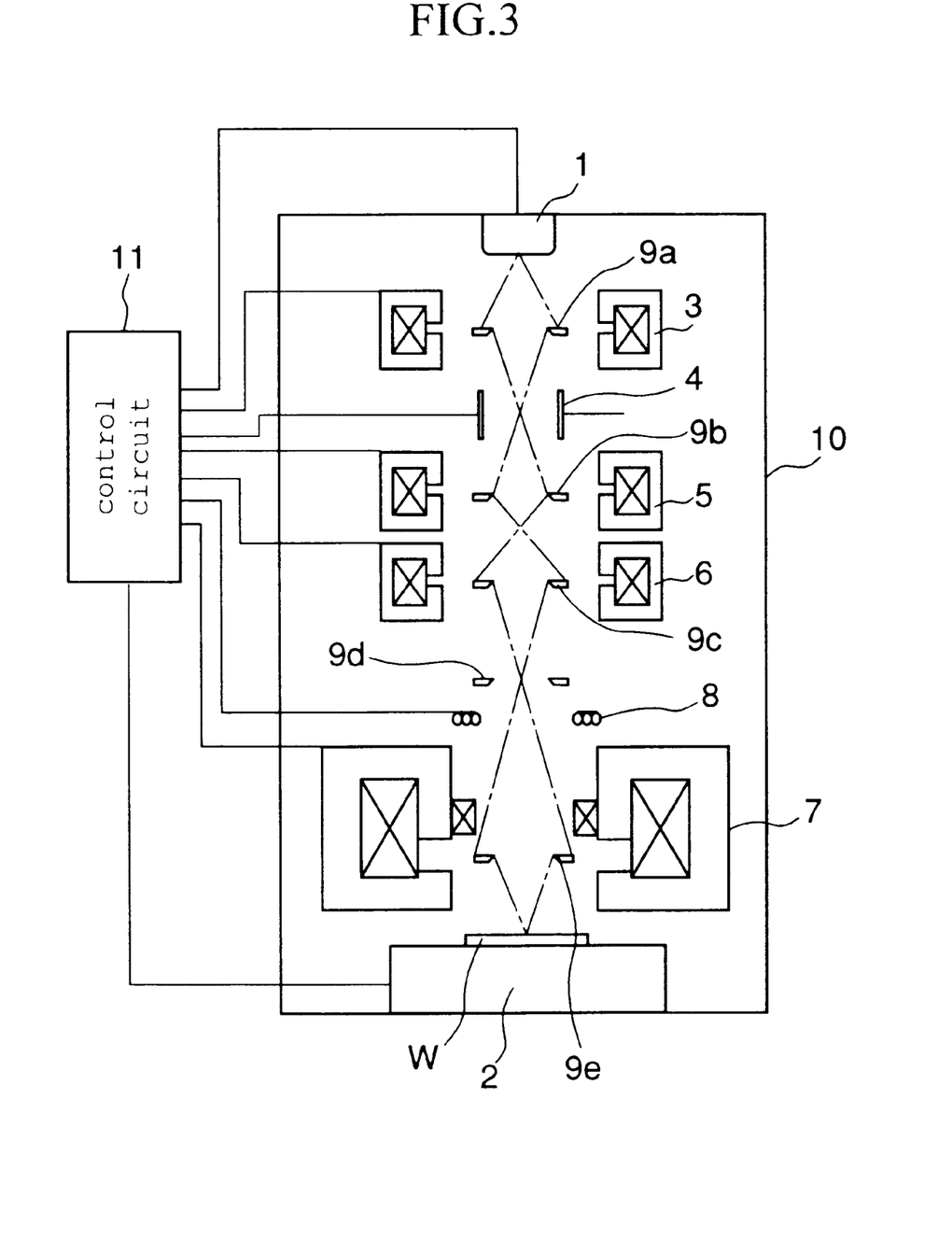
FIG. 3 is a structural diagram illustrating one example of an apparatus for electron beam exposure to be used in this invention.

The apparatus for exposure to an electron beam to be used in embodying the present invention has such a structure as is illustrated, for example, in FIG. 3. In an exposure chamber 10 illustrated in FIG. 3, a first condenser lens 3, a beam blanker 4, a second condenser lens 5, a third condenser lens 6, and a fourth condenser lens 7 are sequentially arranged in the order mentioned from the output part of an electron source 1 through a wafer stage 2. A deflection coil 8 is disposed between the third condenser lens 6 and the fourth condenser lens 7.

Apertures 9a–9e are disposed in the areas of the first-fourth condenser lenses 3, 5, 6, and 7 for passage of an electron beam and in the vicinity of a deflection coil 8 and they are used for adjusting the electron beams in shape.

The emission of the negative charge from the electron source 1, the adjustment of the first-fourth condenser lenses 3, 5, 6, and 7 in focal position, etc. is controlled by the control signals supplied from a control circuit 11 based on the image data. The electron beam emitted from the electron source 1 is projected toward a sample W on the wafer stage 2. The wafer stage 2 is so constructed as to be moved in the X and Y directions which perpendicularly intersect each other. The motion of the wafer stage 2 is controlled by the control circuit 11. The term "image data" as used herein refers to not only the image data for ordinary exposure of the resist but also the image data for preliminary exposure.

Now, the exposure by means of the apparatus for exposure to the electron beam described above will be explained below.

EXAMPLE 1

Figure 4A:
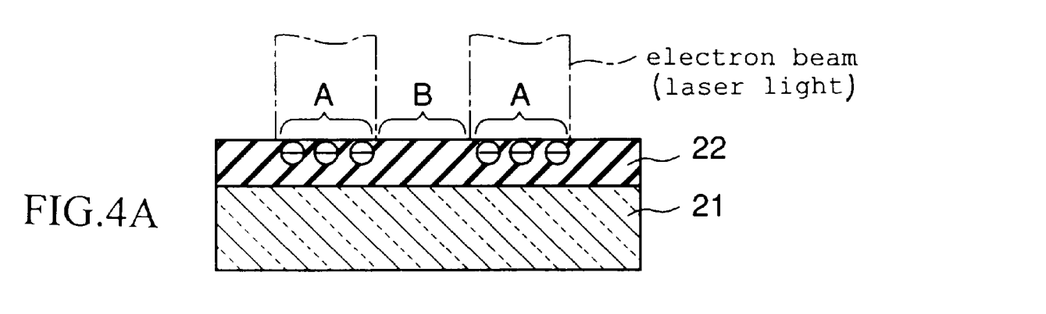
FIG. 4A–FIG. 4D are cross sections illustrating the first example of a process for resist patterning according to the first embodiment of this invention.

First, a dielectric layer 22 is formed on an undercoating layer 21 made of a conductor, insulator, or semiconductor as illustrated in FIG. 4A and the resultant composite is used as the sample W. As the material for forming this dielectric layer 22, such ferroelectric materials as, for example, strontium titanium oxygen ($SrTiO_3$), cerium oxygen ($CeO_2$), barium titanium oxygen ($BaTiO_3$), and lead titanate zirconate ($PZT(Pb(Zr_xTi_{1-x})O_3)$) besides silicon oxide ($SiO_2$) and silicon nitride ($Si_3N_4$) are available.

Thereafter, the sample W is set on the wafer stage 2 of the apparatus for exposure to electron beam illustrated in FIG. 3. Then, the first areas A on the dielectric layer 22 is exposed to an electron beam based on the image data for preliminary exposure. The first areas A adjoin the second area B in which the dielectric layer 22 is intended to survive the step of patterning which will be specifically described herein below. The amount of the electric current for the electron beam is in the range of $1\times10^{-11}$–$1\times10^{-9}$ A. On the surface of the dielectric layer 22 which has been exposed to the electron beam using an electric current falling in this range, a negative charge of a charge density of 90–200 $\mu C/cm^2$ is allowed to persist. This charge density is adjusted by varying the duration of exposure to the electron beam.

Figure 4B:
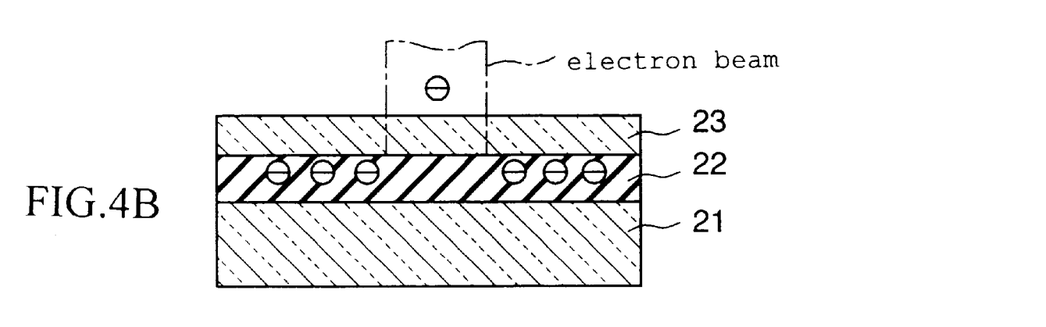

After the exposure of the dielectric layer 22 to the electron beam has been completed, the sample W is extracted from the apparatus for exposure to the electron beam and then set on a resist coating device (not shown) as illustrated in FIG. 4B.

On the dielectric layer 22, a negative type EB resist layer 23 is applied in a thickness in the range of 200–400 nm. As concrete examples of a negative type EB resist material, the product of Tokyo Ohka Kogyo Co., ltd. marketed under product code of "OEBR100" and the product of Toray Industries, Inc. marketed under product code of "CMS" may be cited.

Figure 4C:
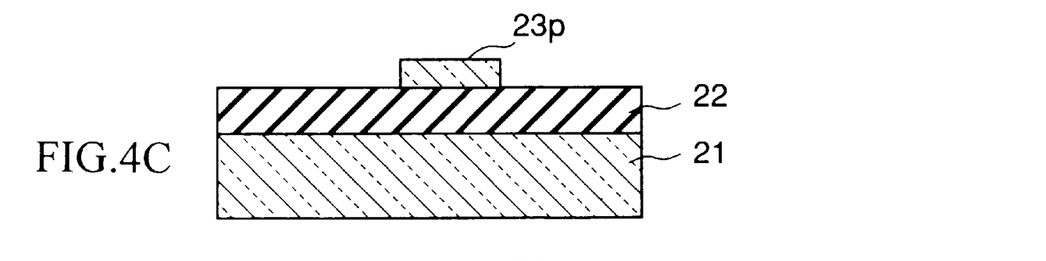

Next, the sample W is again set on the wafer stage 2 of the apparatus for exposure to the electron beam. The electron beam is projected in the direction of the second area B in which the dielectric layer 22 is intended to persist so as to effect the exposure of the EB resist layer 23 to the electron beam as shown in FIG. 4C. In this case, since the second area B encircles the first area A, the electron beam projected in the direction of the second area B is curbed from entering the first area B by the negative charge in the first area A of the dielectric layer 22. Specifically, the electron beam projected in the direction of the second area B is prevented by the repulsive force due to the Coulomb's law from being easily diffused in the first area A and, consequently, is converged to enter the part of the EB resist layer 23 which overlies the second area B. As a result, the latent image to be formed in consequence of the exposure of the EB resist layer 23 to the electron beam enjoys improved precision of pattern.

During the course of the exposure, the negative charge which has permeated through the EB resist layer 23 is accumulated in the second area B of the dielectric layer 22. Since the amount of the charge in the first area A of the dielectric layer 22 is larger than or equal to the amount of the negative charge accumulated gradually in the second area B of the dielectric layer 22, the condition under which the negative charge arising from the exposure to the electron beam is not easily scattered in the ambience can be retained by the negative charge in the second area B.

Figure 4D:
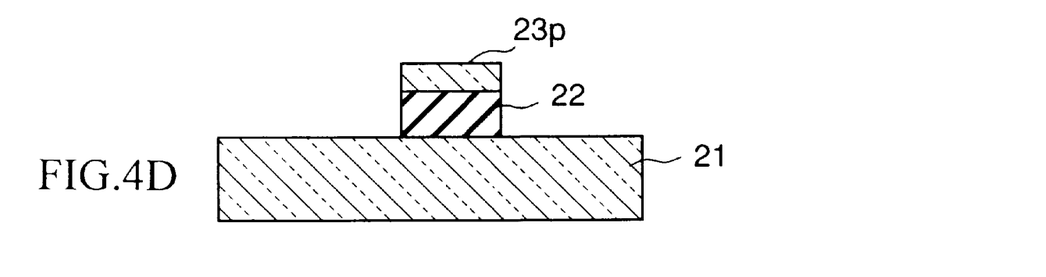

When the EB resist layer 23 is immersed in a developer after the completion of the step of such exposure to the electron beam as described above, the EB resist layer 23 on the second area B is exclusively retained intact as illustrated in FIG. 4D. As a result, the latent image of the EB resist layer 23 is visualized to form a resist pattern 23p.

The resist pattern 23p is used as a mask to etch the dielectric layer 22 underlying the mask. This etching transfers the shape of the resist pattern 23p to the dielectric layer 22. The EB resist layer 23 is removed thereafter by the use of a resist peeling liquid.

Incidentally, since the EB resist layer 23 which is formed of a material of high resistance hardly permits transfer thereto of the negative charge accumulated in the first area A of the dielectric layer 22, it exerts no adverse effect on the shape of the pattern of itself.

Figure 5A:
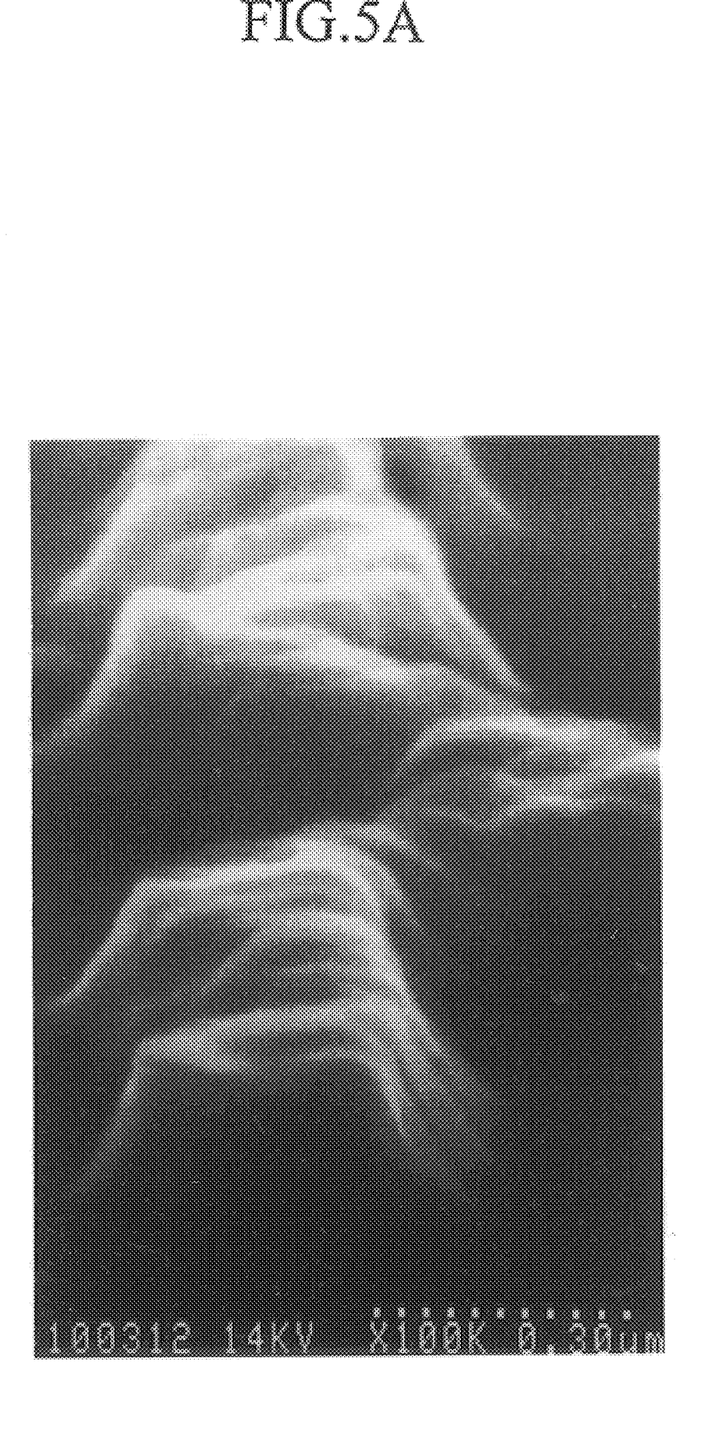
FIG. 5A is a photomicrograph illustrating the shape of a first pattern formed by the first example of the process of patterning according to the first embodiment of this invention.
Figure 5B:
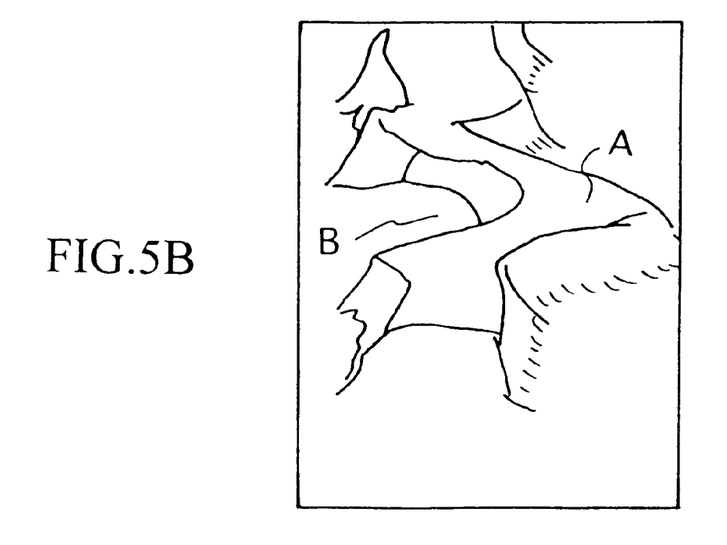
FIG. 5B is a perspective view of the photomicrograph as shown in FIG. 5A.
Figure 5C:
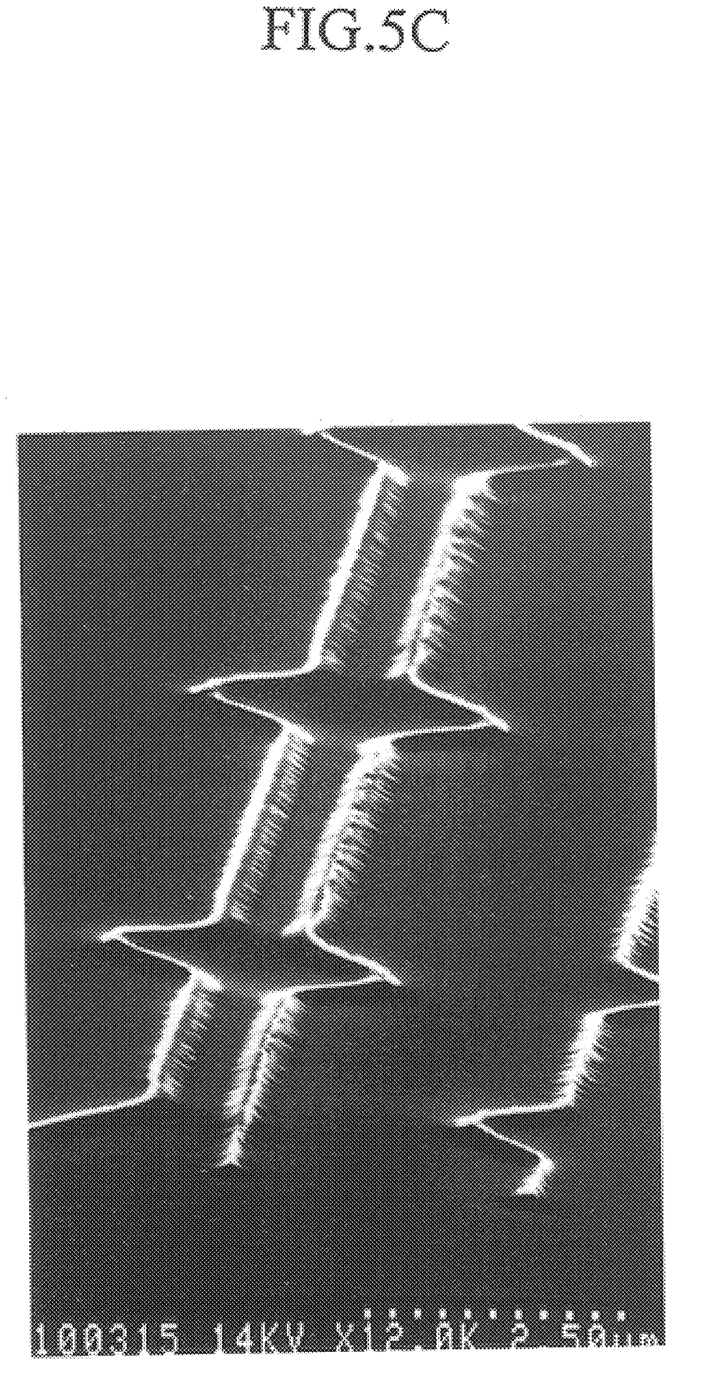
FIG. 5C is a photomicrograph illustrating the shape of the second pattern formed by the first example of the process of patterning according to the first embodiment of this invention.
Figure 5D:
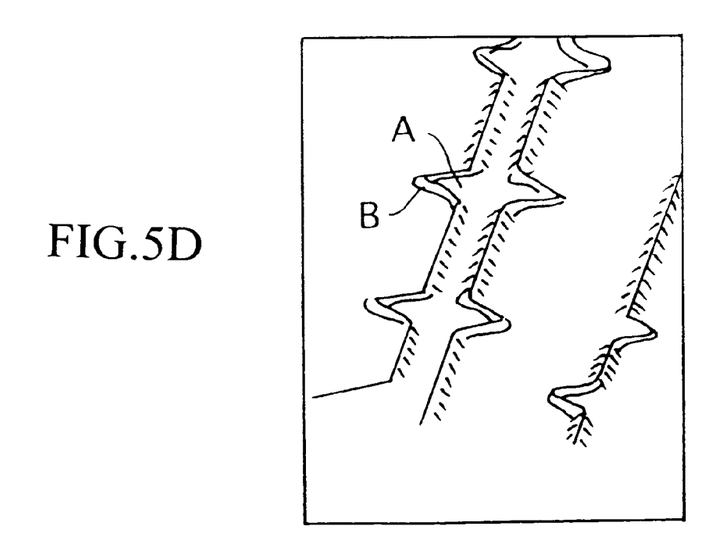
FIG. 5D is a perspective view of the photomicrograph as shown in FIG. 5C.

The pattern of the dielectric layer 22, which is obtained by the step described above, appears like the photomicrographs of FIGS. 5A, 5C, for example. FIGS. 5A or 5C depicts a typical experiment using a substrate incorporating therein the dielectric layer 22 made of $SrTiO_3$ and producing an image by ion milling a resist pattern in the upper layer part of this substrate. In the substrate made of $SrTiO_3$, the first area A has a pattern of dots and the second area A a pattern of stripes circumscribing the first area A as shown in FIGS. 5B and 5D.

A review of this photomicrograph reveals that the pattern has an improved accuracy as evidenced by the fact that the part of the stripes of the $SrTiO_3$ pattern which adjoins the dots of the first area A has a sharply raised lateral edge part.

In the description given above, though the exposure of the first area A of the dielectric layer 22 to the electron beam is depicted as a method for accumulating the negative charge in the first area A, this invention does not preclude use of some other method. When the dielectric layer 22 formed of $SrTiO_3$ is set under an atmosphere of a reduced pressure of $1\times10^{-6}$ Torr and the dielectric layer 22 is exposed to an excimer laser (248 nm in wavelength), for example, the area of the dielectric layer 22 exposed to the laser is inevitably fated to generate and accumulate a negative charge on account of depletion of oxygen.

Incidentally, the patterning of the dielectric layer can be applied, for example, to the patterning of a dielectric layer which constitutes a component of a capacitor.

The EB resist layer to be adopted herein may be in a positive form. As one example of using the EB resist layer of the positive type, the step of forming a contact hole in an interlayer insulating layer of a semiconductor device will be described below.

Figure 6A:
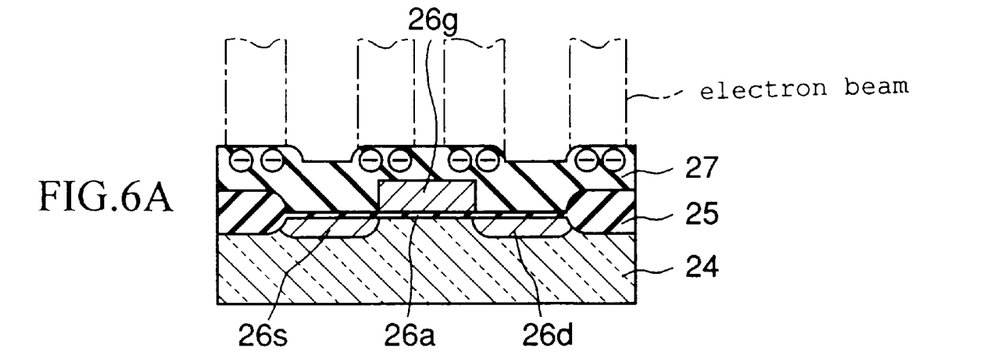
FIG. 6A–FIG. 6D are cross sections illustrating a step for forming a semiconductor device by the use of the first example of the process of patterning according to the first embodiment of this invention.

A MOS transistor 26 is produced on a silicon substrate 24 containing a p type impurity by forming a gate insulating layer 26a, a gate electrode 26g, a source area 26s, and a drain area 26d in an area of the silicon substrate 24 which is enclosed with an element separating insulating layer 25 as illustrated in FIG. 6A. Then, an interlayer insulating film 27 of $SiO_2$ is grown on the MOS transistor 26.

Figure 6B:
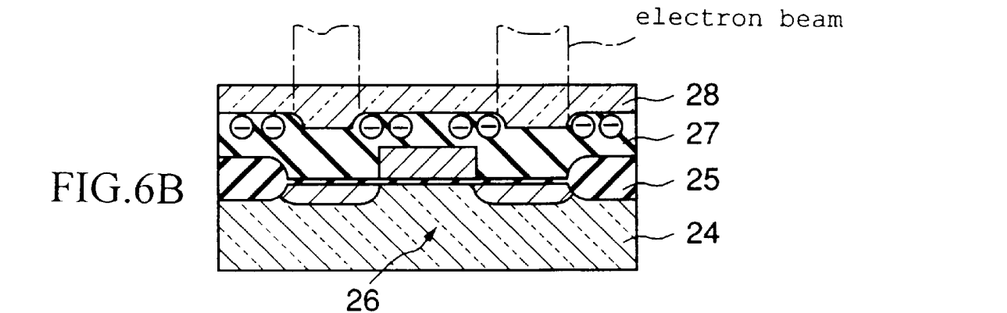

Subsequently, a negative charge is accumulated on the upper faces of the parts of the interlayer insulating film 27 which enclose the source area 26s and the drain area 26d. Thereafter, a positive type FE resist 28 is applied on the interlayer insulating film 27 as illustrated in FIG. 6B and the parts of the EB resist 28 which overlie the source 26s and the drain area 26d are exposed to an electron beam by the use of an apparatus for exposure to the electron beam.

Figure 6C:
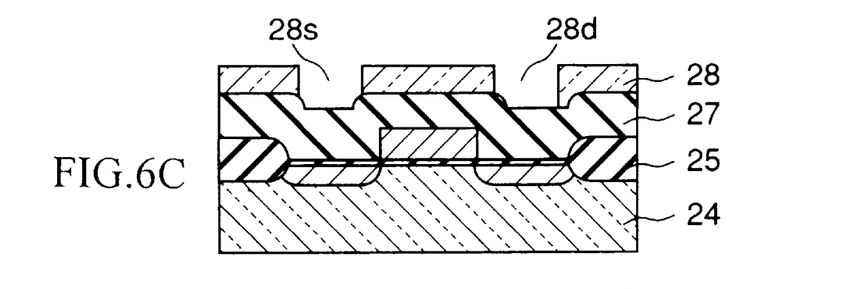

Next, the EB resist 28 is developed to form windows 28s and 28d respectively on the source area 26s and the drain area 26d and the interlayer insulating film 28 is etched through these windows 28s and 28d to form contact holes in the interlayer insulating film 28 as shown in FIG. 6C.

Figure 6D:
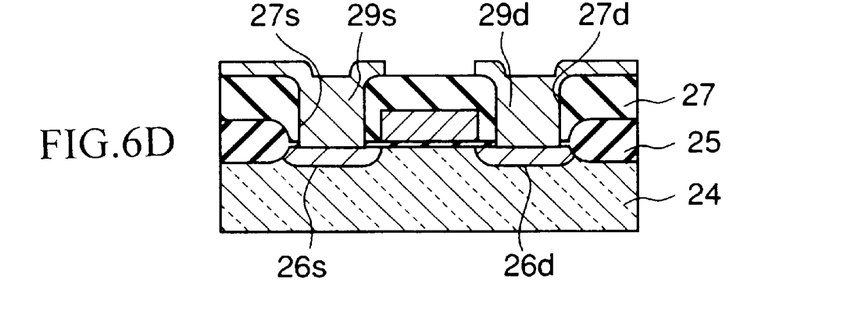

Thereafter, a source outgoing wiring 29s for connection to the source area 26s is formed on the interlayer insulating film 27 via the contact hole 27s and a drain outgoing wiring 29d for connection to the drain area 26d is formed on the interlayer insulating film 27 via the contact hole 27s as illustrated in FIG. 6D.

EXAMPLE 2

Though Example 1 has described highly accurate formation of a latent image in the EB resist layer by the accumulation of the negative charge in the dielectric layer (insulating layer), this invention does not preclude use of a positive charge for the accumulation. Now, one example of using the positive charge for the accumulation will be described below. This example concerns a step for fabricating a GaAs layer.

The apparatus for exposure to an ion beam in this example is essentially identical in structure with the apparatus of FIG. 3 except a Ga ion source is used in the place of the electron source.

Figure 7A:
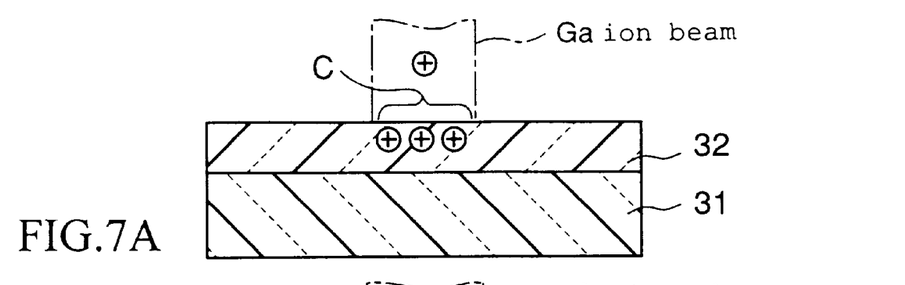
FIG. 7A–FIG. 7E are cross sections illustrating a second example of the process of resist patterning according to the first embodiment of this invention.

First, a GaAs layer 32 is formed on the main face of a semi-insulating GaAs substrate 31 as illustrated in FIG. 7A. Then, the first area C of the GaAs layer 32, in which a depressed part is to be formed, is exposed to a Ga ion beam. A positive charge is accumulated in the first area C of the GaAs layer 32 which has been exposed to the Ga ion beam. This exposure is so adjusted that the density of the accumulated positive charge falls in the range of 90–200 $\mu C/cm^2$.

Figure 7B:
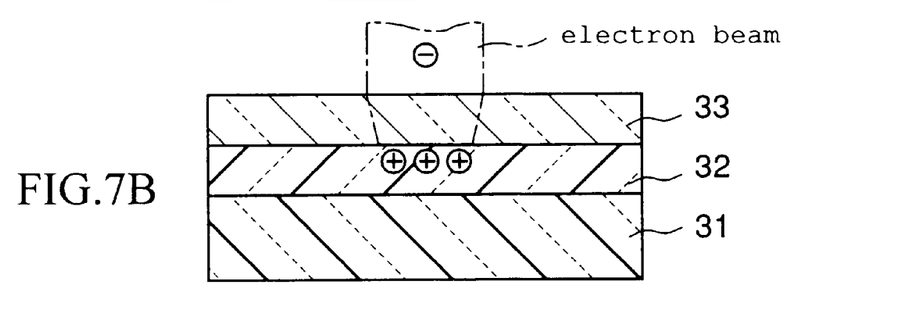

Next, the resultant laminate is placed in a device for resist application (not shown) and an EB resist is applied in a thickness in the range of 200–400 nm on the main face of the GaAs layer 32 to form an EB resist 33 as shown in FIG. 7B. The EB resist 33 is a positive type different from the countertype EB resist used in Example 1. As a concrete example of the positive type EB resist, the product of Toray K.K. marketed under product code of "ZCMR" may be cited.

Subsequently, the laminate inclusive of the GaAs layer 32 is mounted on the wafer stage 2 of the apparatus for exposure to the electron beam illustrated in FIG. 3 and the EB resist 33 thereof is exposed to the electron beam.

When the EB resist 33 directly overlying the first area C is exposed to the electron beam, the electron beam is caused to impinge in a converging state on the first area C of the GaAs layer 32 while accompanying virtually no outward diffusion in the EB resist 33. The reason for this behavior of the electron beam is that since the positive charge is accumulated in the first area C of the GaAs layer 32, the electron beam is attracted to the first area C by the attracting force due to Coulomb's law and the negative charge is not easily scattered outward.

Incidentally, since the first area C of the GaAs layer 32 is exposed to part of the electron beam which has permeated through the EB resist 33 and consequently the positive charge accumulated in the first area is diminished during the course of exposure, the positive charge is preferred to be accumulated in an amount such that it is not wholly depleted during the course of the exposure.

Figure 7C:
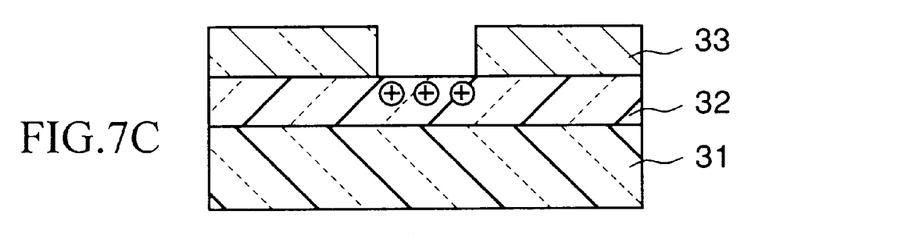
Figure 7D:
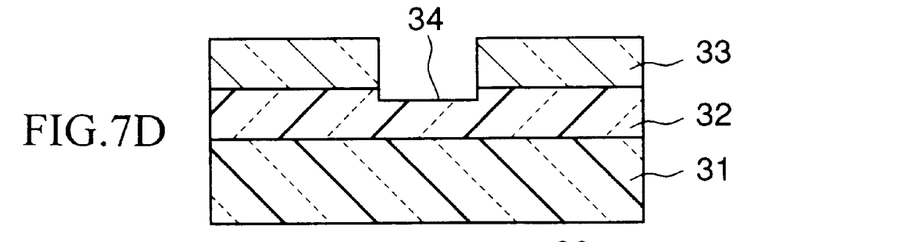

After the exposure performed as described above has been completed, the developer is supplied to the EB resist 33 to impart a pattern to the EB resist 33 as illustrated in FIG. 7C. Subsequently, the pattern of the EB resist 33 is used as a mask to etch the upper layer of the GaAs layer 32 and form a recess 34 as illustrated in FIG. 7D.

Thereafter, the EB resist 33 is removed with a solvent to complete the formation of the structure of a recess.

Figure 7E:
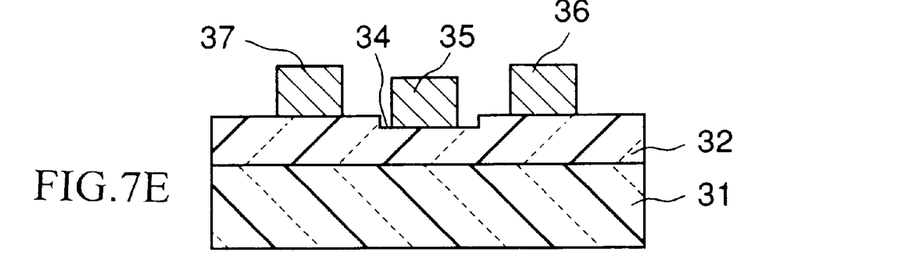

Next, an n type impurity such as, for example, silicon is thermally diffused in the GaAs layer 32 to transform the GaAs layer 32 into the N type. Subsequently, a gate electrode 35 is formed on the bottom face of the recess 34 as shown in FIG. 7E. This gate electrode 35 is formed of a material such as, for example, tungsten which is capable of forming a Schottky junction with the GaAs layer 32. Further, a source electrode 36 and a drain electrode 37 are formed on the parts of the GaAs layer 32 adjoining the opposite sides of the recess 34. The source electrode 36 and the drain electrode 37 are severally formed of a material such as, for example, gold which is capable of forming an ohmic junction with the GaAs layer 32. In the GaAs layer 32, an MESFET (metal-semiconductor FET) is formed in the GaAs layer 32.

Figure 8:
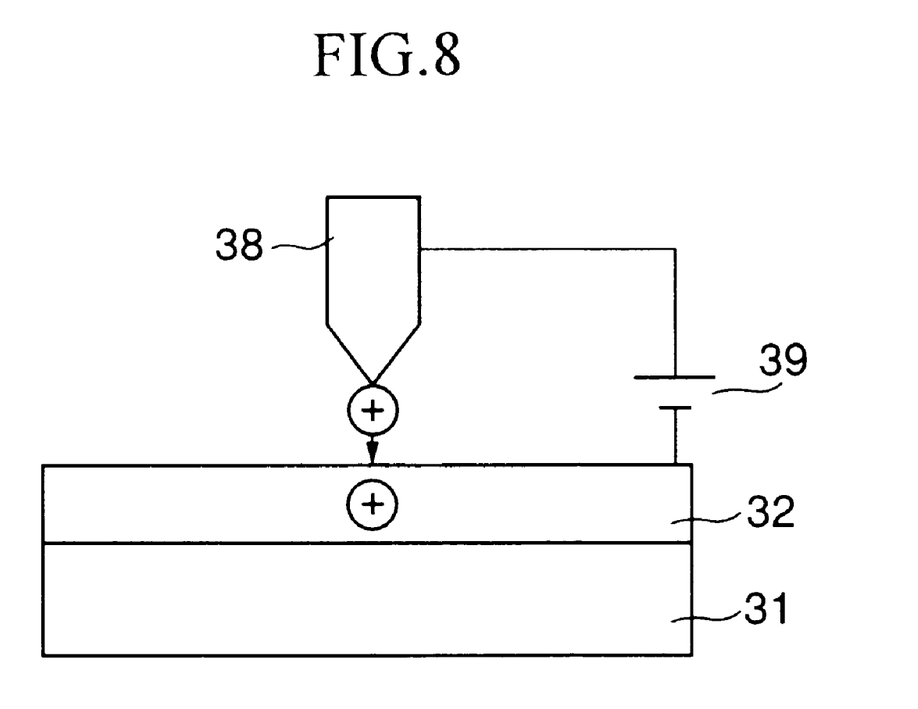
FIG. 8 is a diagram illustrating another method for the second example of Ga ion irradiation according to the first embodiment of this invention.

Incidentally, as the apparatus for effecting the exposure to a Ga ion beam, a scanning tunneling microscope (STM) may be used in the place of the apparatus described above. For example, the Ga ions may be emitted from a probe 38 of the STM toward the GaAs layer 32 to draw a pattern of electric charge on the face of the GaAs layer 32 as illustrated in FIG. 8 and thereafter the steps of applying, exposing, and developing the EB resist 33 may be sequentially carried out in the order mentioned as described above. In the diagram, the reference numeral 39 denotes a DC power source.

According to the method described above, a pattern can be formed in an extreme fineness essentially of the unit of one atom. On the contrary, the fact that the pattern is formed in the unit of one atom implies that the formation of a large pattern consumes much time. This method, therefore, requires these two contradictory factors to be harmonized.

Incidentally, the object for patterning does not need to be limited to the layer of such a chemical semiconductor as GaAs but may be a layer of a dielectric substance or a layer of a simple elementary semiconductor. Optionally, lithium (Li) ions may be used in the place of the Ga ions for irradiating the main face of the dielectric layer or the semiconductor layer.

EXAMPLE 3

Example 1 and Example 2, for the purpose of repressing the diffusion of electron beams being used for the exposure, adopt the method of exposing the film or substrate subjected to patterning to an electron beam or a positive ion beam. The present example describes a method for forming a resist pattern of perfect accuracy on a film or a substrate without resorting to such exposure to the electron beam or ion beam as mentioned above.

Figure 9A:
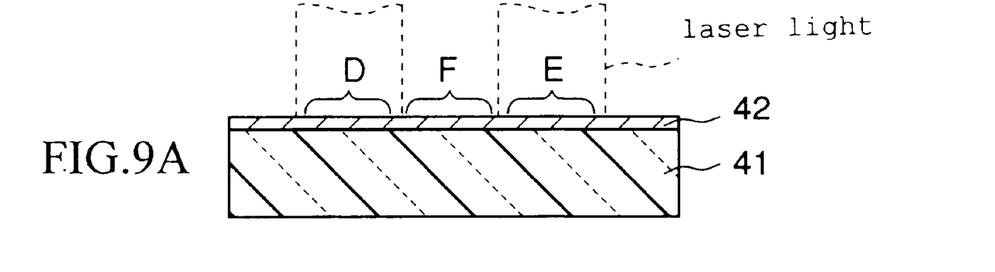
FIG. 9A–FIG. 9D are cross sections illustrating a third example of the process of resist patterning according to the first embodiment of this invention.

First, an arsenic (As) layer 42 is formed in a thickness of 100 nm on a silicon substrate 41.

Figure 9B:
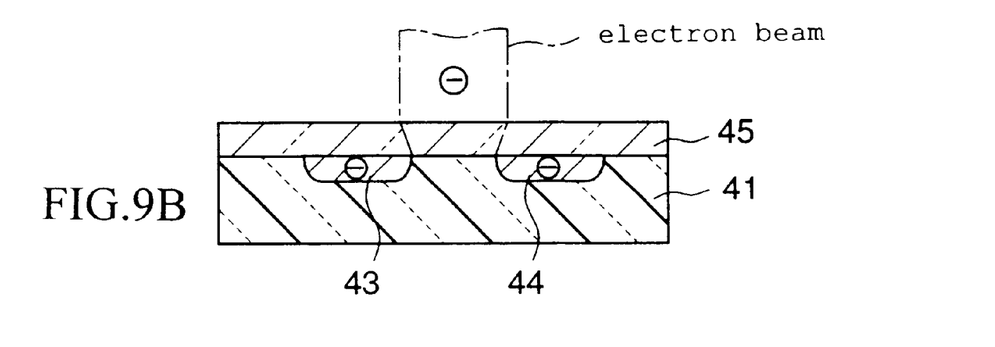

Thereafter, a laser beam is projected toward a first area D and a second area E of the silicon substrate 41 to fuse part of the silicon substrate 41 as illustrated in FIG. 9A. As a result, two negative carrier layers (impurity diffused layers) 43 and 44 are formed on the faces of a semiconductor layer 41 in the first and second areas D and E of the silicon substrate 41 as illustrated in FIG. 9B.

Next, the As layer 42 is removed by the use of an aqueous hydrogen peroxide solution. Then, a negative type EB resist is applied on the silicon substrate 41 to form an EB resist layer 45 as illustrated in FIG. 9B.

Further, an electric field is externally imparted to the two carrier layers 43 and 44 so as to induce retention of a state of increased negative charge in these carrier layers 43 and 44. When the electron beam is subsequently projected by the use of the apparatus for exposure to an electron beam illustrated in FIG. 1 toward a third area F of the silicon substrate 41 which is interposed between the carrier layers 43 and 44, the electron beam generates Coulomb force (repulsive force) jointly with the negative charge in the carrier layers 43 and 44 and consequently incurs difficulty in diffusing above the carrier layers 43 and 44. As a result, a latent image is formed in the EB resist layer 45 and the pattern of this latent image is curbed from diffusion and enabled to acquire very high accuracy similar to the pattern obtained in Example 1.

Figure 9C:
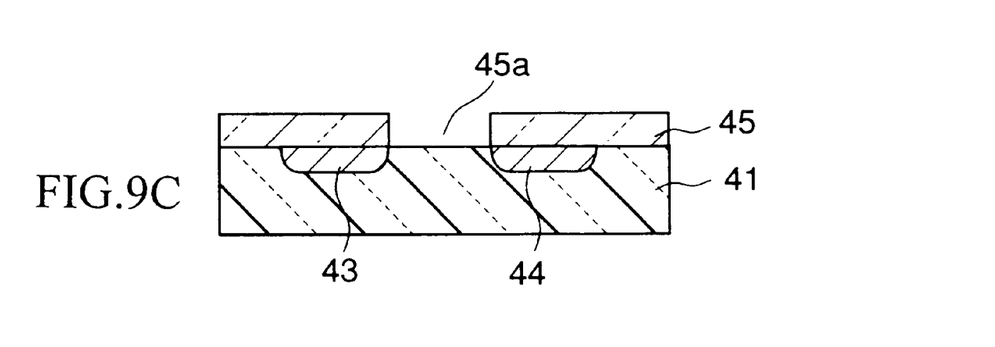

When a developer is subsequently supplied to the EB resist layer 45, a window 45a is formed on the third area F as illustrated in FIG. 9C.

Figure 9D:
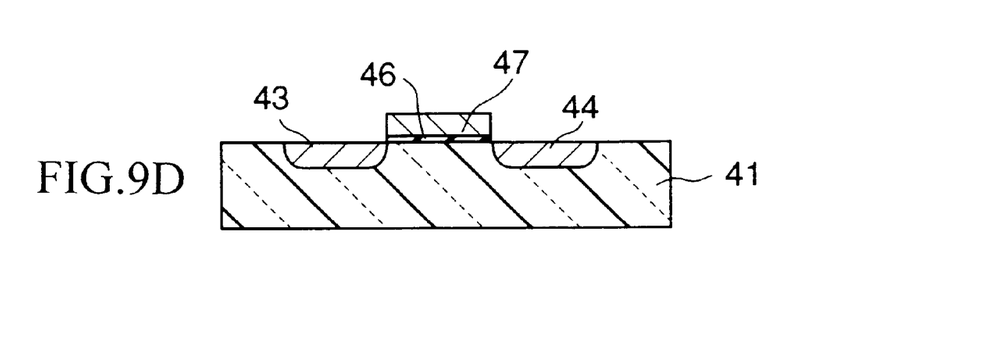

Thereafter, when a gate insulating film 45 and a gate electrode 47 are grown via the window 45a and the EB resist layer 45 is removed with a solvent, the structure of a MOSs transistor is formed in the semiconductor layer 43 as illustrated in FIG. 9D. Incidentally, the two carrier layers 43 and 44 are transformed respectively into a source area and a drain area.

As concrete examples of the impurity to be introduced into the silicon substrate 41, phosphorus, boron, and gallium may be cited besides arsenic.

EXAMPLE 4

Examples 1–3 cited above have described the prevention of the diffusion of an electron beam within the resist layer by the accumulation of electric charge on the face of the dielectric layer and the semiconductor layer. The present example describes a method for preventing the diffusion of the electron beam by utilizing a conducting pattern.

Figure 10A:
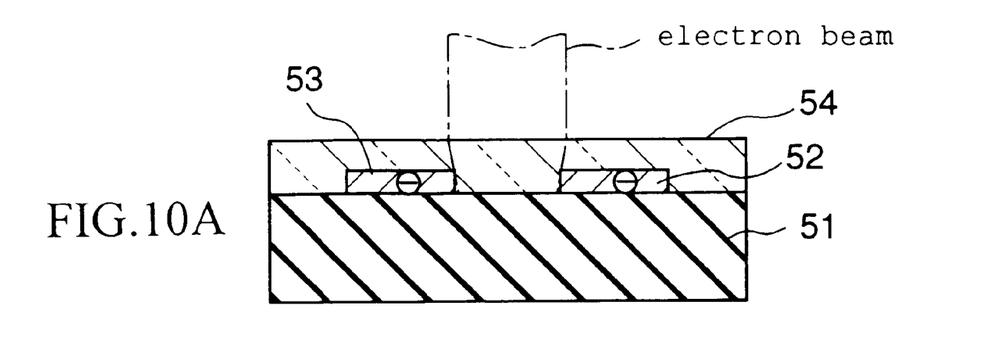
FIG. 10A–FIG. 10D are cross sections illustrating a fourth example of the process of resist patterning according to the first embodiment of this invention.

First, one or a plurality of conducting patterns are formed on a substrate 51 such as of silicon, compound semiconductor, glass, or quartz as illustrated in FIG. 10A. In the present example, glass is used as the material for the substrate 51 and two conducting patterns 52 and 53 are formed on the substrate 51. These conducting patterns 52 and 53 may be formed of a semiconductor containing an impurity, a transparent conducting agent such as indium tin oxide, or a metal such as tungsten or platinum. The conducting patterns 52 and 53 may be formed by patterning a conducting layer by the photolithographic technique or may be formed by patterning a conducting layer by the lift-off technique.

Subsequently, an EB resist layer 54 for covering the conducting patterns 52 and 53 is formed on the substrate 51. This EB resist layer 54 is a positive type, for example.

Figure 10B:
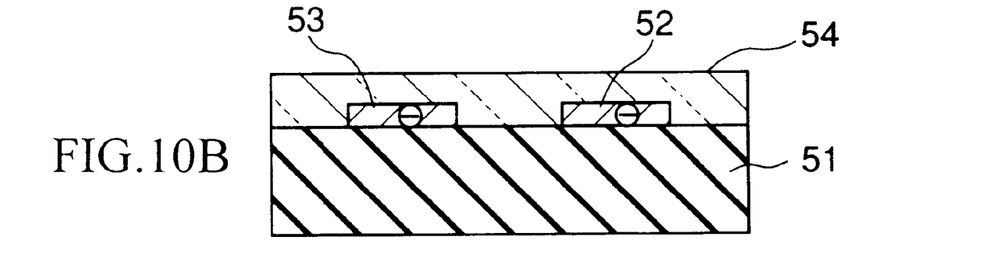

Next, a DC voltage is applied between the substrate 51 and the conducting patterns 52 and 53 to induce accumulation of a negative charge in the conducting patterns 52 and 53, as shown in FIG. 10B.

Thereafter, when the electron beam is projected toward an area interposed between the conducting patterns 52 and 53 by the use of the apparatus for exposure to an electron beam illustrated in FIG. 3, the electron beam injected into the EB resist layer 54, as illustrated in FIG. 10B, is converged between the wiring patterns 52 and 53 under the influence of the Coulomb force due to the charge in the conducting patterns 52 and 53. Specifically, in the EB resist layer 54, the area of exposure is restrained by the negative load in the conducting patterns 52 and 53 and the latent image formed in the EB resist layer 54 is enabled to enjoy high pattern accuracy.

Figure 10C:
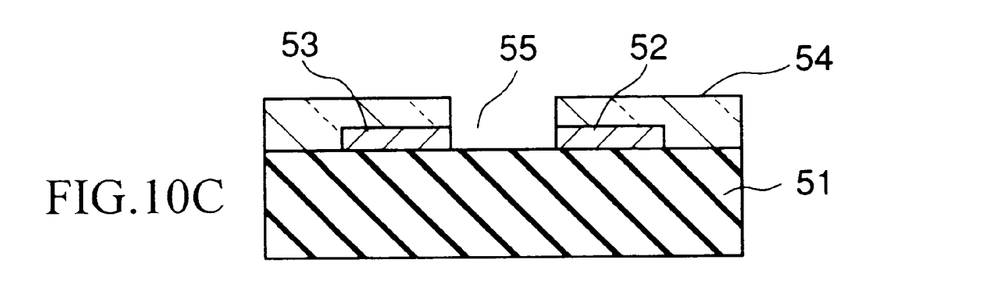

Thereafter, when the EB resist layer 54 is developed, the upper faces of the conducting patterns 52 and 53 are exposed and a resist pattern exposing the lateral faces is formed as illustrated in FIG. 10C. This resist pattern is provided between the conducting patterns 52 and 53 with an opening part 55.

Figure 10D:
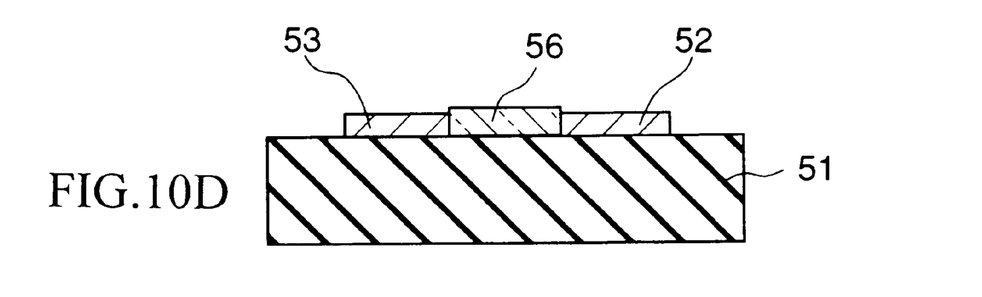

Thereafter, when a silicon layer 56 is formed on the EB resist layer 54 and in the opening part 55 and then the EB resist layer 54 is peeled with a solvent, the silicon layer 56 is left between the two electrode patterns as illustrated in FIG. 10D.

As a result, a thin film transistor is formed on the substrate 51.

(Second embodiment)

The first embodiment, as depicted above, uses an electron beam for the purpose of exposure of a resist and nevertheless does not preclude use of a Ga ion beam. The present embodiment describes a method for the exposure which uses a Ga ion beam.

The apparatus for the exposure to the Ga ion beam is substantially identical in structure to that illustrated in FIG. 3, excepting a Ga ion source is used in the place of the electron source.

Figure 11A:
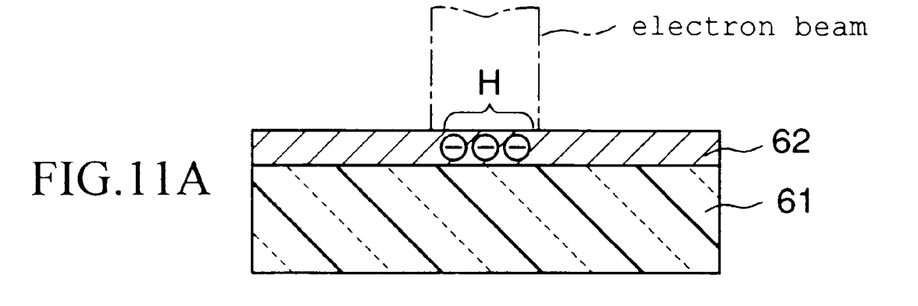
FIG. 11A–FIG. 11D are cross sections illustrating one example of a process of resist patterning according to the second embodiment of this invention.

First, a dielectric layer 62 is formed on an undercoating layer 61 made of a conducting material, an insulating material, or a semiconducting material and this dielectric layer 62 is used as a sample W. As concrete examples of the material for forming the dielectric layer 62, such substances as $SiO_2$, $Si_3N_4$, $SrTiO_3$, $CeO_2$, $BaTiO_3$, and PZT which are cited in the first embodiment above may be cited.

Thereafter, an electron beam is projected toward a first area H on the upper face of the dielectric layer 62 as illustrated in FIG. 11A by using the apparatus as show in FIG. 3. This first area H is fated to seat the dielectric layer 62 formed by the patterning step which will be described specifically herein below. The density of the electric charge in the first area H is adjusted by regulating the amount of the electron beam to be used for exposure similar to Example 1 of the first embodiment.

After the exposure of the dielectric layer 62 to the electron beam has been completed, the sample W is extracted from the apparatus for exposure to an electron beam and a negative resist layer 63 is formed in a thickness in the range of 200–400 nm on the dielectric layer 62. For the resist, the same material as cited in Example 1 of the first embodiment is used.

Figure 11B:
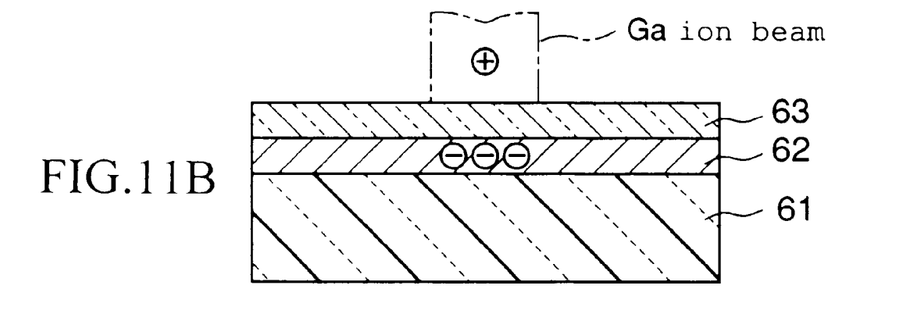

Next, the sample W is mounted on a wafer stage of an apparatus for exposure to a Ga ion beam (not shown) and a Ga ion beam is projected toward the first area H destined to seat the dielectric layer 62 to expose the resist layer 63 as shown in FIG. 11B. In this case, the Ga ion beam projected toward the first area H is converged into the first area H by the Coulomb force generated jointly with the negative charge on the dielectric layer 62. As a result, the latent image formed by the exposure of the resist layer 63 enjoys an improved pattern accuracy.

Incidentally, since the amount of the negative charge of the first area H is diminished by the positive charge which permeates through a resist layer 63 and invades the first area H of the dielectric layer 62, the negative charge to be accumulated is preferred to be adjusted in advance such that it is not wholly depleted before the exposure to the Ga ion beam is completed.

Figure 11C:
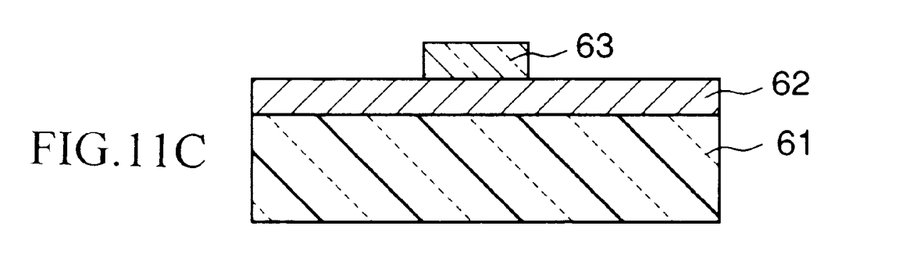

After the step of exposure to the Ga ion beam performed as described above has been completed, the resist layer 63 is developed such that the EB resist layer 63 remains exclusively on the first area H as shown in FIG. 11c.

Figure 11D:
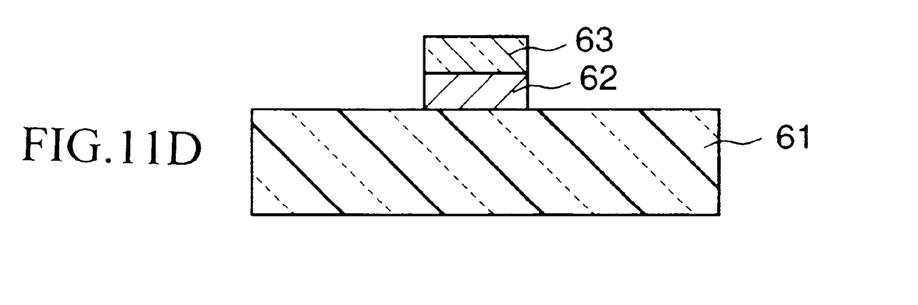

Further, the pattern of the resist layer 63 is used as a mask to etch the dielectric layer 63 underlying the mask as shown in FIG. 11D. As a result, the pattern of the resist layer 63 is transferred to the dielectric layer 62. Thereafter, the resist layer 63 is removed with a resist peeling liquid.

Incidentally, the resist layer 63 does not need to be limited to the negative type. At times, the resist layer 63 of a positive type may be selected.

Though the method for accumulating the negative charge in the first area H, as described above, relies on the exposure of the first area H of the dielectric layer 62 to the Ga ion beam, the present invention does not preclude use of some other method. When the dielectric layer 62 made of $SrTiO_3$ is set position in an atmosphere of a reduced pressure of $1\times10^{-6}$ Torr and then exposed to an excimer laser (248 nm in wavelength), for example, the area of the dielectric layer 62 of $SrTiO_3$ which has been exposed to the laser incurs depletion of oxygen and consequently generates and accumulates negative charges.

Optionally, by causing the second area of the dielectric layer 62, which is interposed between the two separate zones of the first area H, to accumulate a positive charge by exposure to the Ga ion beam, the repulsive force due to Coulomb's law may be utilized for converging the Ga ion beam in the resist layer 63 which directly overlies the first area H.

Thus, by using the Ga ion beam in the place of the electron beam of the first embodiment and selecting the polarity, plus or minus, of the electric charge to be accumulated in the film underlying the resist layer used in the first embodiment, the present embodiment is enabled to attain the same patterning as in the first embodiment.

As described above, this invention comprises preliminarily accumulating a negative charge or a positive charge on the face of a film to be fabricated (film under treatment), then applying a resist on the film under treatment, and subsequently exposing the resist to an electron beam or an ion beam, and further developing the exposed resist.

The negative charge or the positive charge which has impinged on the resist, therefore, is enabled to generate the Coulomb force jointly with the charge preliminarily accumulated on the surface of the film under treatment and consequently prevented from diffusing on the surface of the film under treatment, with the result that the possibility of the latent image formed in the resist being blurred will be allayed and the formation of a resist pattern of high accuracy will be accomplished.

What is claimed is:

1. A method for patterning a film comprising:
   accumulating a first polarity electric charge selectively in a first area with which a second area adjoins alternately on a face of a said film;
   applying a resist to the face of said film;
   exposing said resist by projecting said first polarity electric charge selectively to a part of said resist overlying said second area;
   developing said resist and patterning said resist; and
   etching a part of said film which has not been covered with said patterned resist, thereby patterning said film.

2. A method according to claim 1, wherein said accumulation of said first polarity electric charge is effected by projecting an electrified beam toward said film.

3. A method according to claim 1, wherein said accumulation of said first polarity electric charge is effected by projecting a positive ion beam toward said film.

4. A method according to claim 1, wherein said accumulation of said first polarity electric charge is effected by the use of a scanning type tunneling microscope.

5. A method according to claim 1, wherein said film is a dielectric film made of an oxide and said accumulation of said first polarity electric charge consists of accumulating a negative electric charge by exposing said dielectric film to a laser beam and causing said dielectric film to incur a depletion of oxygen.

6. A method for patterning a film comprising:
   accumulating a first polarity electric charge selectively in a first area with which a second area adjoins alternately on a face of said film;
   applying a resist to the face of said film;

exposing said resist by projecting a second polarity electric charge selectively toward a part of said resist overlying said first area;

developing said resist and patterning said resist; and etching a part of said film which has not been covered with said patterned resist, thereby patterning said film.

7. A method according to claim 6, wherein said first polarity electric charge is a negative electric charge and said second polarity electric charge is a positive electric charge or said first polarity electric charge is a positive electric charge and said second polarity electric charge is a negative electric charge.

8. A method according to claim 6, wherein said first area has a conducting pattern formed therein and said accumulation of said first polarity electric charge in said film is attained by applying an electric field to said conducting pattern.

9. A method according to claim 6, wherein said accumulation of said first polarity electric charge is effected by projecting an electrified beam toward said film.

10. A method according to claim 6, wherein said accumulation of said first polarity electric charge is effected by projecting an ion beam toward said film.

11. A method according to claim 6, wherein said accumulation of said first polarity electric charge is effected by the use of a scanning type tunneling microscope.

12. A method according to claim 6, wherein said film is a dielectric film made of an oxide and said accumulation of said first polarity electric charge consists of accumulating a negative electric charge by exposing said dielectric film to a laser beam and causing said dielectric film to incur a depletion of oxygen.

13. A method for exposing a resist film comprising:

accumulating an electric charge selectively in a surface of a first area of a film which is next to a second area;

forming said resist film on said film; and exposing said resist film by projecting a charge selectively to a portion of said resist film overlying said second area.

14. A method for exposing a resist film comprising:

accumulating a first polarity electric charge in a first area, the first area alternately adjoining a second area on a surface of the film;

applying a resist to the surface of the film; and exposing the resist by selectively projecting the first polarity electric charge to a part of the resist overlying the second area.

* * * * *